(12) United States Patent
Ivanovich Shveykin (10) Patent No.: US 8,204,092 B2
(45) Date of Patent: Jun. 19, 2012

(54) INJECTOR EMITTER

(75) Inventor: Vasily Ivanovich Shveykin, Moscow (RU)

(73) Assignee: General Nano Optics Limited, Nicosia (CY)

( * ) Notice: Subject to any disclaimer, the term of this patent is extended or adjusted under 35 U.S.C. 154(b) by 383 days.

(21) Appl. No.: 11/997,883

(22) PCT Filed: Jul. 7, 2006

(86) PCT No.: PCT/RU2006/000361
§ 371 (c)(1),
(2), (4) Date: Feb. 4, 2008

(87) PCT Pub. No.: WO2007/018450
PCT Pub. Date: Feb. 15, 2007

(65) Prior Publication Data
US 2008/0219310 A1 Sep. 11, 2008

(30) Foreign Application Priority Data
Aug. 5, 2005 (RU) .................. 2005124939

(51) Int. Cl.
*H01S 5/042* (2006.01)
(52) U.S. Cl. .............. 372/45.01; 372/44.01; 257/13; 257/183
(58) Field of Classification Search .......... 257/13, 257/79, 85, 90, 94, 183; 372/44, 45, 49, 372/50, 96, 99
See application file for complete search history.

(56) References Cited

U.S. PATENT DOCUMENTS

| | | | |
|---|---|---|---|
| 5,779,924 A * | 7/1998 | Krames et al. ......... | 216/24 |
| 5,793,062 A * | 8/1998 | Kish et al. ............ | 257/98 |
| 5,818,860 A * | 10/1998 | Garbuzov et al. ........ | 372/45.01 |
| 6,057,562 A * | 5/2000 | Lee et al. ............. | 257/96 |
| 6,429,462 B1 * | 8/2002 | Shveykin ............. | 257/95 |
| 6,486,499 B1 * | 11/2002 | Krames et al. ......... | 257/81 |
| 6,649,938 B1 * | 11/2003 | Bogatov et al. ........ | 257/95 |
| 6,748,002 B2 * | 6/2004 | Shveykin ............ | 372/45.01 |
| 6,777,871 B2 * | 8/2004 | Duggal et al. ......... | 313/506 |
| 7,447,248 B2 * | 11/2008 | Miyajima et al. ....... | 372/45.01 |
| 7,839,909 B2 * | 11/2010 | Shveykin ............ | 372/44.01 |
| 2001/0033135 A1 * | 10/2001 | Duggal et al. ......... | 313/506 |
| 2002/0109148 A1 * | 8/2002 | Shveykin ............. | 257/95 |
| 2004/0136424 A1 * | 7/2004 | Shveykin ............. | 372/44 |

FOREIGN PATENT DOCUMENTS

| | | |
|---|---|---|
| RU | 1829853 A1 | 11/1994 |
| RU | 2142661 C1 | 12/1999 |
| RU | 2208268 C2 | 7/2003 |
| SU | 1829853 A1 | 11/1994 |

* cited by examiner

*Primary Examiner* — Ha Tran T Nguyen
*Assistant Examiner* — Jordan Klein
(74) *Attorney, Agent, or Firm* — Haynes and Boone, LLP; Pavel I. Pogodin (57) ABSTRACT

Injection emitters (light-emitting diodes, superluminescent emitters) are used in the form of highly-efficient solid state radiation sources within a large wavelength range and for wide field of application, including general illumination using white light emitters provided with light-emitting diodes. Said invention also relates to superpower highly-efficient and reliable injection surface-emitting lasers, which generate radiation in the form of a plurality of output beams and which are characterized by a novel original and efficient method for emitting the radiation through the external surfaces thereof.

14 Claims, 7 Drawing Sheets

INJECTOR EMITTER

FIELD OF THE INVENTION

The invention relates to the optoelectronic technology and namely to the effective powerful and compact semi-conducting injection emitters including the light diodes.

DESCRIPTION OF THE RELATED ART

Various types of injection emitters are known: the light diodes—[S. Nakamura et al, Appl. Phys. Lett. v. 76, 22, 2000], [S. Nakamura et al, IEEE Journ. Select. Topics Quantum Electron. v. 7, 188, 2001], [Y. Narukawa, Optics & Photonics News, April 2004, pp. 25-29], the superluminiscent emitters—[Gerard A. Alfonse et al. JEEE Journal of Quantum Electronics, vol. 24, No. 12, December 1988, pp. 2454-2457], [A. T. Semenov et al., Electronics Letters, 1993, vol. 29, No. 10, pp. 854-857].

From the standpoint of technical substance and technical problem to be solved the closest injection non-coherent emitter-prototype was described in the following work [V. I. Shveykin, USA, U.S. Pat. No. 6,429,462 B1, Aug. 6, 2004] including the heterostructure, containing the active layer, confining layers, ohmic contacts and output region of emission which made transparent for said emission, output region located at least on the one side of the active layer and adjacent to the corresponding confining layer. The said output region is at least one and consists at least of one sublayer. The output region is characterized by the refraction index $n_{orq}$, the coefficient of optical losses of emission $\alpha_{orq}$, $cm^{-1}$, the thickness $d_{orq}$, μm, where q=1, 2, ... p are the integer numbers, designating serial numbers of the layers of the output region which are calculated from its boundary with the heterostructure. The heterostructure with the output region connected to it is characterized by the effective refraction index $n_{eff}$. At that the values of the effective refraction index $n_{eff}$ and of the refraction index $n_{or1}$ were chosen in such a way that they satisfy the following relation:

$$\arccos(n_{eff}/n_{or1}) \leq (n_{eff\,min}/n_{or1}), \text{ and while } n_{eff\,min} \text{ is greater than } n_{min},$$

where $n_{eff\,min}$—is the minimum value of $n_{eff}$ among all possible values of $n_{eff}$ for the multitude of heterostructures with the emission output regions being of practical value and $n_{min}$—is the least of the refraction indexes in the heterostructure confining layers.

The basic advantage of the injection emitter—prototype consists in possibility to increase efficiency of the emitter what is achieved through the fact that in the volume of the emitter-prototype a certain part of the spontaneous emission is formed in the form of the directed outflow emission with the following effective output of it. But further increase of efficiency is limited by the indicated part of the directed spontaneous emission which is determined by the proposed versions of the emitters-prototypes in which capture of the spontaneous emission into the waveguide and its output in the form of the directed output leaky emission are spatially combined.

SUMMARY OF THE INVENTION

The basis of the present invention is the creation of the injection emitter (hereafter—the Emitter) of the new type functioning in the known broad range of wavelengths with the controlled output of emission out of the active layer in the form of the multitude of the output beams.

Technical results relating to the proposed Emitter consist in the fact that its dimensions are in principle unlimited (in the first place—the length), the emission power has increased significantly (including significant increase of the emitter power calculated for 1 $mm^2$ of the Emitter area), that the efficiency of transformation of electric energy supplied to the Emitter into the output emission (below—the efficiency) has increased significantly and also that the efficiency rises with increase of the density of the flowing current, the level of the output emission extraction has increased, temperature dependence of the Emitter efficiency has decreased, the Joule losses have decreased, the internal optical losses of emission have decreased significantly, the lifetime and reliability have increased by simultaneous simplification of the technological process of the Emitter manufacture.

According to the invention the above indicated technical result is achieved through the fact that the injection emitter was proposed which includes the semiconducting heterostructure containing at least the active layer and the waveguide layers consisting of at least one sublayer and also the lateral sides of the emitter, the metallization layers consisting of at least one sublayer and the longitudinal optical axis. In this case in the said heterostructure in the direction of the longitudinal optical axis at least one sequence consisting of alternating emission generation region consisting of at least one subregion and emission output region consisting of at least one subregion is formed. At that in above indicated sequence on the surface of the external layer of the heterostructure on the side opposite of the emission output side and on the lateral sides of emitter, as well as in the generation region on the surface of the external layer of the heterostructure on the side to the emission output the corresponding substances are placed the refraction index of which is significantly less than the effective refraction index of the heterostructure in the generation regions. In the output regions together with the heterostructure layers there is a semiconducting leak-in layer consisting of at least one sublayer and raising above the external surface of the generation regions. Every output region on its opposite sides in the direction of the longitudinal optical axis is restricted by the output facets located under certain linear inclination angles $\alpha_1$ and $\alpha_2$, correspondingly, with respect to the external surface of the generation region. At that the ratio of the refraction index $n_{IN}$ of the leak-in layer to the effective refraction index $n_{eff}$ of the heterostructure in the output region with the leak-in layer included into it is equal to the number greater than one.

Significant distinction of the proposed Emitter consists in the new non-obvious and effective way of achievement of the above indicated technical result. For the first time it was proposed to realize extraction of emission from the Emitter in two stages. At the first stage the spontaneous emission generated in the active layer is captured and propagates into two opposite directions along the longitudinal optical axis of the rigid volumetric waveguide formed in the emission generation regions. At the second stage the spontaneous and also partly forced emissions (with increase of the current density) get into the output regions which are the continuation of the generation regions. At that the composition, structure and dimensions of the output regions and of their output facets are such that the emission output is realized in the form of the outflow emission with controlled directivity and divergence. The best parameters can be achieved when the key component of the Emitter (generation region—output region) of appropriate sizes is correspondingly distributed over the Emitter area.

The technical result is also achieved through the fact that heterostructure in the generation region on the side of emission output has such composition and thickness of the layers when only partial (incomplete) restriction of emission in the heterostructure in the generation region on the side of emission output is realized. At that on the external surface of the heterostructure of the generation region on the side of emission output at least one metallization layer with the high emission reflection coefficient is placed. In some cases the said metallization layer is placed directly on the waveguide layer of the heterostructure.

The technical result is also achieved through the fact that the sequence of the alternate generation regions and the output regions has such compositions and thicknesses of the heterostructure layers when on the side opposite to emission output side only partial (incomplete) restriction of emission in the heterostructure is realized. At that on the external surface of the heterostructure from the above said side at least one metallization layer with the high emission reflection coefficient is placed. In some cases the said metallization layer is placed directly on the waveguide layer of the heterostructure.

The technical result is also achieved through the fact that the generation regions are executed at least of two stripe generation subregions located in the direction of the longitudinal optical axis. The space between the stripe generation subregions (in the lateral confining regions) are filled by the corresponding substance the refraction index of which is less than the effective refraction index of the heterostructure in the indicated generation subregions.

The technical result is also achieved through the fact that corresponding metallization layer is placed on the output regions on the external surface of the leak-in layer.

The technical result is also achieved by the below proposed of execution of the output regions of the Emitter.

The linear inclination angles of the output facets $\alpha_1$ and $\alpha_2$ are chosen equal to each other by the absolute values and equal to $(\pi/2)$. At that the thickness of the leak-in layer located in the output region exceeds the length of the output region multiplied by the tangent of the angle $\phi$ of the emission leak from the active layer into the leak-in layer where the angle $\phi$ is determined as arc cosine of the ratio $n_{eff}$ to $n_{IN}$. In practice by absence of the clarifying optical films on the output facets the thickness of the leak-in layer is chosen equal to two or three length values of the output region multiplied by the tangent of the outflow angle $\phi$.

In the next version the linear angles $\alpha_1$ and $\alpha_2$ are chosen equal to each other by the absolute values and equal to $(\pi/2)+(\phi)$. In this case the emission output region in the longitudinal cross-section has the form of trapezium. For increase of the Emitter efficiency the clarifying optical films are applied on the output facets of the emission output regions. Thickness of the leak-in layer in the output region of emission is chosen not less than the length of the emission output region multiplied by the tangent of the outflow angle $\phi$ and divided by one plus squared tangent of the outflow angle $\phi$.

In the other version the linear angles $\alpha_1$ and $\alpha_2$ are chosen equal to each other by the absolute values and equal to $(\pi/4)+(\phi/2)$. In this case the emission output region in the longitudinal cross-section has the form of the upturned trapezium and the output emission goes out through the external surface of the emission output region by direct incidence upon it.

In the next version the linear angles $\alpha_1$ and $\alpha_2$ are chosen equal to each other by the absolute values and equal to $(3\pi/4)-(\phi/2)$. In this case the output region in the longitudinal section has the form of trapezium and the output emission goes out through the substrate by direct incidence upon it. For increase of the Emitter efficiency the clarifying optical films are connected onto the substrate at least in the places of the emission output.

The technical result is also achieved through the fact that the Emitter includes at least two said sequences of the alternating generation regions and output regions connected in parallel by the current. Through this increase of the emission power is achieved.

The technical result is also achieved through the fact that the Emitter includes at least two said sequences of the alternating generation regions and output regions connected in series by the current. Through this increase of the emission power is achieved.

The technical result is also achieved through the fact that the Emitter contains corresponding luminescent substance on the emission output side. Through this corresponding transformation of the frequency contents of the emission is achieved including obtaining white light.

The technical result is also achieved through the fact that the Emitter contains corresponding epoxy substance having appropriate form and corresponding value of the refraction index. This corresponding epoxy substance is placed on the emission output side. Through this corresponding angular distribution of the output emission and increase of the Emitter efficiency are achieved.

Essence of the present invention consists in creation in its integral execution of the new type of the Emitter with surface output of emission out of the active layer in the form of the great number of beams based on the proposed original effective and non-obvious way of the emission output using properties of the outflow emission. The proposed original and non-obvious key component of the Emitter: emission generation region—emission output region, distributed along the whole length (in principle unlimited) of the Emitter secures effective capture (collection) of emission into optical waveguide of the generation region with the following effective outflow out of the output region in the form of outflow emission with controlled directivity and divergence. The Emitter is characterized by in principle not limited dimensions, by high emission extraction efficiency, by low internal optical losses, by low Joule losses, by low density of the emission power on the output facets, and consequently this secures achievement of technical results listed on the page 2.

BRIEF DESCRIPTION OF THE DRAWINGS

The present invention is explained with the help of the FIGS. 1-14.

In the FIG. 11—the angles are equal to $(\pi/2)+(\phi)$,
In the FIG. 12—the angles are equal to $(\pi/4)+(\phi/2)$,
In the FIG. 13—the angles are equal to $(3\pi/4)-(\phi/2)$.

DESCRIPTION OF PREFERRED EMBODIMENTS

In the following the invention is explained through the versions of its realization with references to the enclosed drawings. The presented examples of modifications of the Emitter aren't unique and assume presence of other realizations including certain ranges of wave lengths the features of which are reflected in the set of features of the Claims.

The proposed Emitter 1 (see FIG. 1-3) contains the heterostructure on the substrate 2 based on the AlGaInN compounds with the active layer 3 of InGaN, the waveguide layers 4, 5, and the confining layers 6, 7 of AlGaN, correspondingly, on the side of the emission output and on the side opposite to it, namely—on the side of the substrate 2. Non-conducting sapphire ($Al_2O_3$) having the refraction index of 1.77 is used as the substrate 2. The wavelength of the laser emission is chosen equal to 0.45 µm. The sequence of the alternating stripe generation regions 8 and output regions 9 of the Emitter 1 is located in the direction of the chosen longitudinal optical axis. On the lateral sides the said regions 8 and 9 are restricted by the lateral confining regions 10 made of dielectric $Al_2O_3$. In the generation region 8 both on the side of emission output and on the side of the substrate 2 compositions and thickness values correspondingly of the confining layers 6 and 7 are chosen in such a way that partial restriction of emission in the heterostructure is realized. The output region 9 in contrast to the generation region 8 contains additional semi-conducting emission leak-in layer 11 made of GaN and its distinctive feature consists in the fact that its refraction index $n_{IN}$ exceeds the effective refraction index $n_{eff}$ of the heterostructure with the leak-in layer 11 included into it. The output facets 12 confining the output region 9 along the longitudinal axis are perpendicular to the external surface of the generation region wherein the linear angles $\alpha_1$ and $\alpha_2$ are equal to each other by the absolute value and equal to 90°. In this case the output regions 9 raising above the external surfaces of the amplification regions 8 have the form of the rectangular parallelepiped. The thickness value of the confining layer 6 in the output region 9 and in the generation region 8 are unequal (see FIG. 1). The confining layer 6 on the side of emission output is doped with the p-type impurity. The metallization sublayer 13 is connected to the confining layer 6 in the generation region 8 and to the lateral confining regions 10 along the total length of the Emitter 1. The said metallization sublayer 13 made of silver having the reflection coefficient approximately equal to 95% by direct incidence of emission. On the side of the sapphire substrate 2 the so-called "lateral contact" is formed through connection of the corresponding metallization layer 14 to the n-type doped confining layer 7 (see FIGS. 2 and 3). The length of the Emitter 1 is chosen equal to 4010 µm. The lengths of all generation regions 8 and output regions 9 are chosen equal to 40 µm and 10 µm correspondingly and at that the number of the generation regions 8 and output regions 9 formed in the Emitter 1 were equal to 80 and 81 correspondingly (in the FIG. 1 only two and three correspondingly are shown). The thickness of the leak-in layer 11 in the output region 9 is made equal to 4 µm. Output emission of the Emitter 1 consists of 160 beams a half of which is directed in one direction along the longitudinal optical axis and another half—in the opposite direction. Through the corresponding choice of compositions and thickness values of the heterostructure layers and of the leak-in layer 11 the outflow angle $\phi$ was chosen equal to 10°. At that the angle of refraction $\beta$ on the output facets 12 of the output beams was obtained equal to 25°. The chosen thickness (4 µm) of the leak-in layer 11 is approximately equal to the product of the length of the emission output region 9 multiplied by two tangents of the outflow angle $\phi$. In this case the calculated part of the emission output by double incidence of beams on the output facet 12 makes up approximately 93%. Diffraction divergence of every beam is equal to 7.3°. Assessment value of efficiency of the Emitter 1 (without taking into account ohmic losses) is within the range of 70%-85%.

The following modification of the Emitter 1 (see FIG. 4-5) differed from the previous one through the fact that instead of the removed sapphire substrate 2 [M. Kneissl et al, IEEE Journ. Select. Topics Quant. Electron., v. 7 p. 188, 2001] the metallization layer 15 made of silver was connected to the confining layer 7. Further, the Emitter 1 together with the connected conducting plate 16 (the coefficient of thermal expansion of which is matched with GaN) was set on the copper heat sink base 17.

Figure 6:
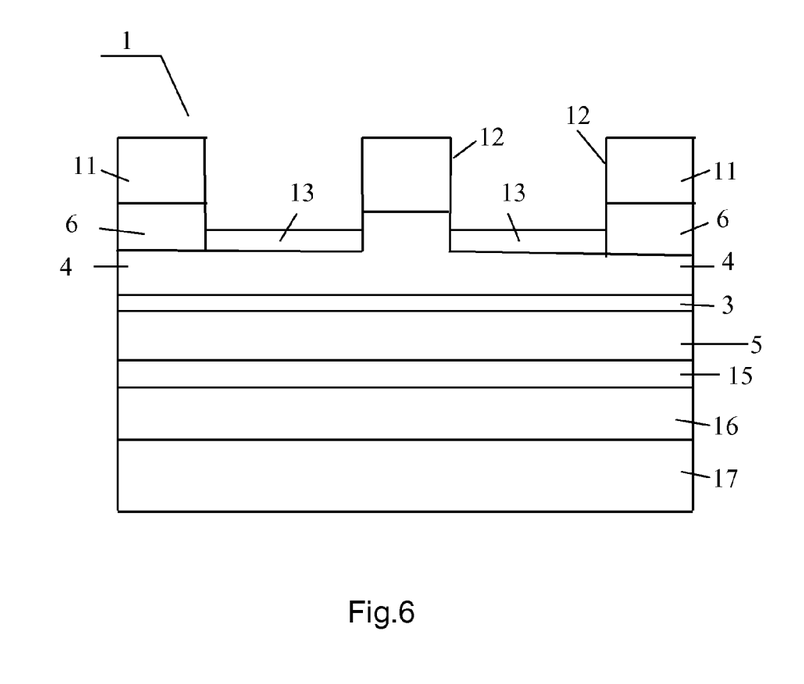
FIG. 6 schematically describes the longitudinal cross-section of the proposed Emitter through one of three generation sub-regions wherein the metallization layers on the side of the emission output and on the opposite side to it the directly connected to the waveguide layers of the heterostructure.
Figure 7:
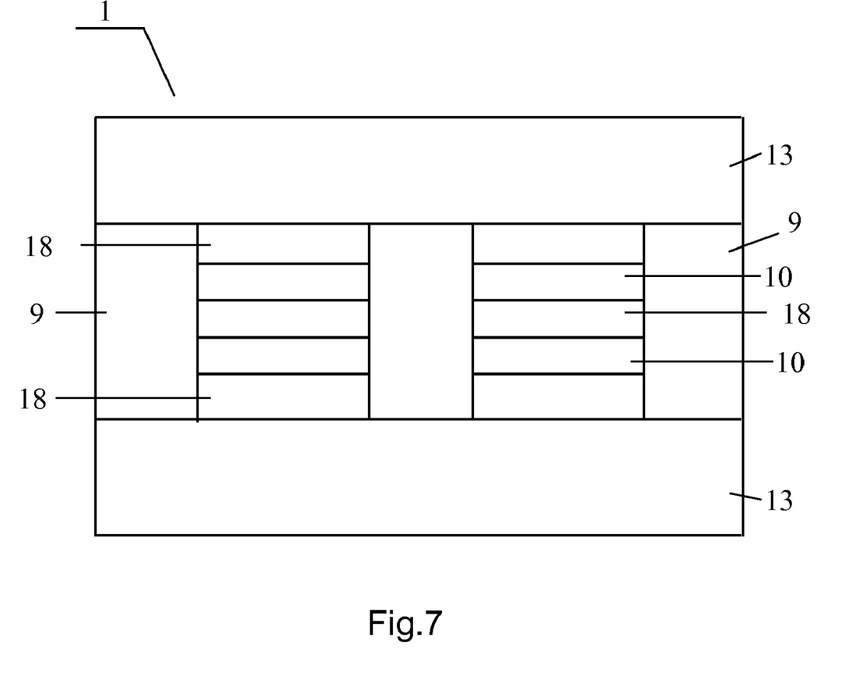
FIG. 7 schematically describes the view from above of the Emitter with the metallization layer removed from the generation regions the longitudinal cross-section of which (of the Emitter) through one of three generation sub-regions is sketched out in the FIG. 6.
Figure 8:
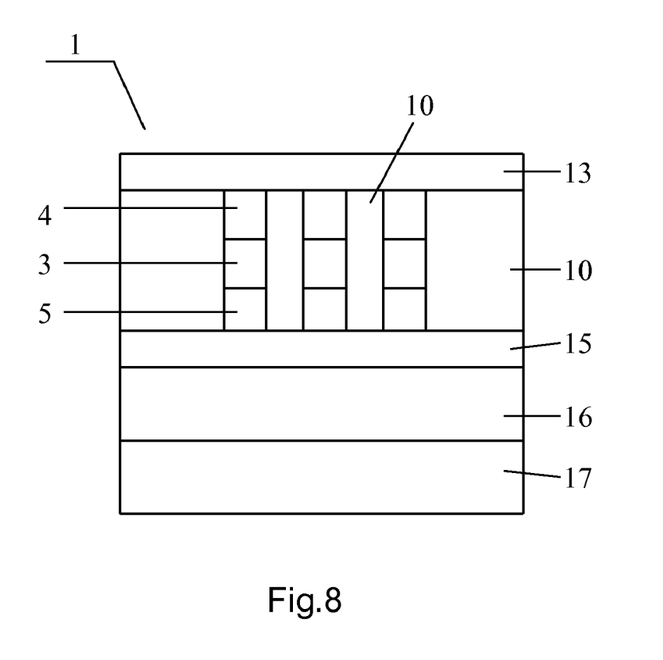
FIG. 8 schematically describes the cross-section of the Emitter passing through the generation region the longitudinal cross-section of which (of the Emitter) is sketched out in the FIG. 6.

The following modification of the Emitter 1 (see FIG. 6-8) differed from the previous one by the fact that every generation region 8 consisted of 100 stripe generation sub-regions 18 with the width of 2 µm each (only three are shown in the FIG. 6-8). At that the width of the output regions 9 was equal to 400 µm. The lateral regions 10 confining the generation sub-regions 18 practically by the whole thickness of the heterostructure are filled with dielectric of $Al_2O_3$ along the whole length of the Emitter 1. Over the generation sub-regions 18 and the lateral confining regions 10 the metallization sublayer 13 (not shown in the FIG. 7) was applied. The said metallization layer 13 includes a sublayer made of silver. Another distinctive feature of the Emitter 1 consists in the fact that the metallization sublayers 13 and 15 are connected directly to the waveguide layers 4 and 5.

Figure 9:
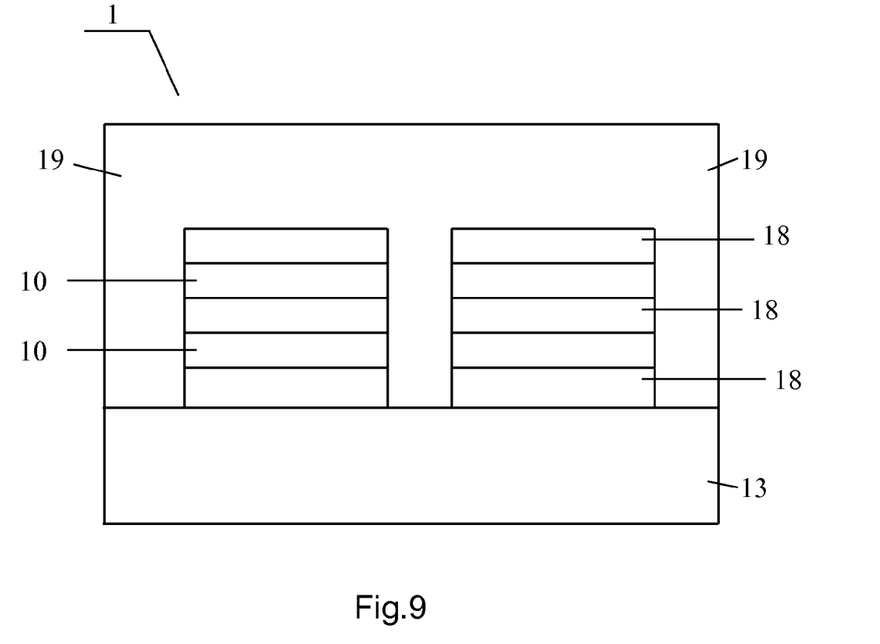
FIG. 9 schematically describes the view from above of the Emitter with the metallization layers connected to the emission output regions the longitudinal cross-section of which (of the Emitter) passing through one of three generation sub-regions without the said metallization layers coincides with the image in the FIG. 6.

The following modification of the Emitter 1 (see FIG. 9) differed from the previous one by the fact that corresponding metallization layers 19 were connected to the leak-in layer 11 of the output regions 9. Connection in parallel by the current of all output regions 9 was executed at the level of the external surface of the leak-in layer 11 through expansion of the metallization layers 19 towards one of the lateral sides of the Emitter 1. At that parallel connection by the current of all generation sub-regions 18 is made by application of the metallization sublayer 13 onto the opposite lateral side of the Emitter 1 (the metallization sublayer 13 on the generation subregions 18 is not shown in the FIG. 9).

Figure 1:
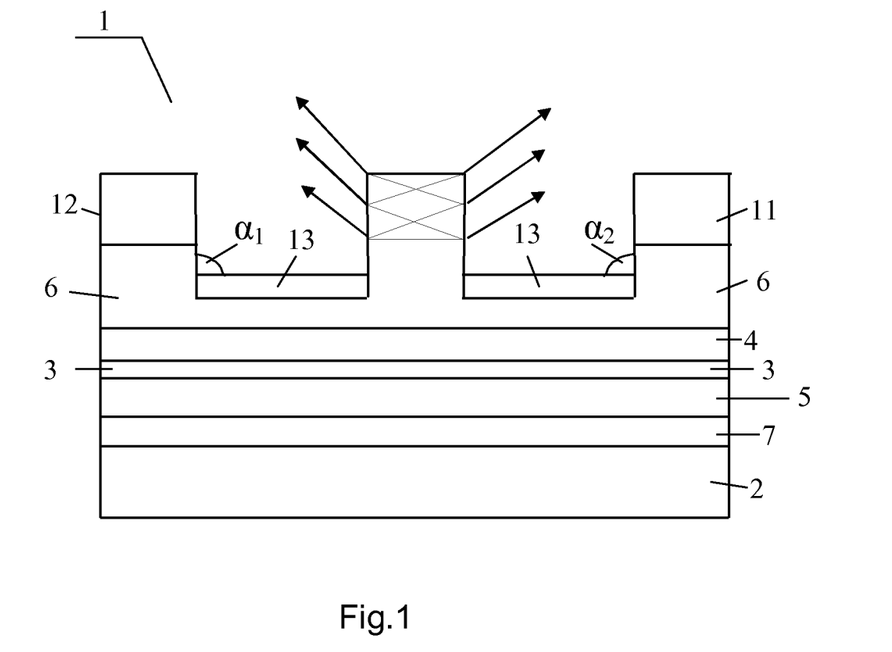
FIG. 1 schematically describes the longitudinal cross-section of the proposed Emitter with the alternating stripe generation regions and output regions on the sapphire substrate wherein the output facets of the output regions are perpendicular to the external surface of the generation region.
Figure 2:
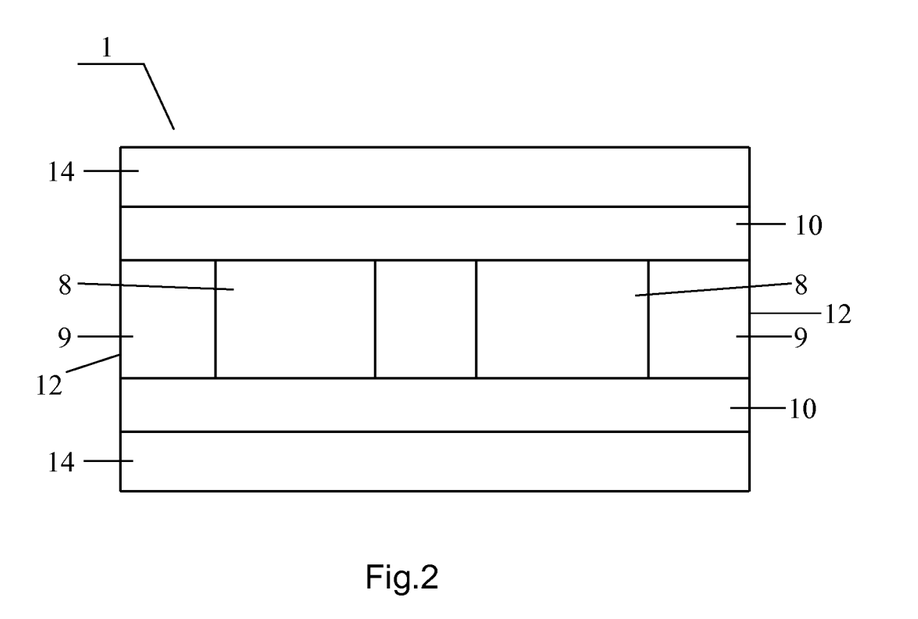
FIG. 2 schematically describes the view from above of the Emitter with the metallization layer removed from the generation regions and adjacent to them lateral confining regions the longitudinal cross-section of which (of the Emitter) is sketched out in the FIG. 1.
Figure 3:
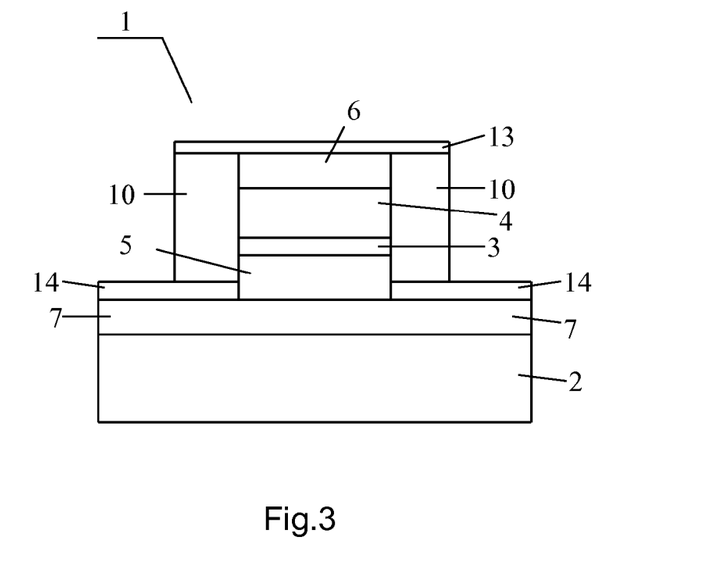
FIG. 3 schematically describes the cross-section passing through the generation region of the Emitter the longitudinal cross-section of which is sketched out in the FIG. 1.
Figure 10:
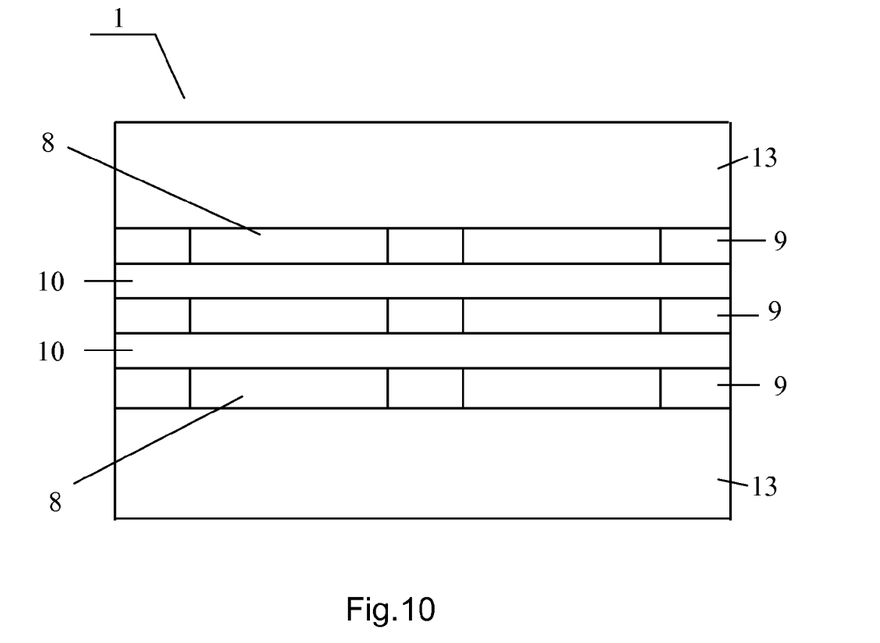
FIG. 10 schematically describes the view from above of the Emitter with three sequences of the alternating generation regions and output regions which are in parallel connected by the current the longitudinal cross-section of which (the Emitter) along one of the indicated sequences coincides with the picture in the FIG. 1.

The following modification of the Emitter 1 (see FIG. 10) differed from the modification shown in the FIG. 1-3 by the fact that the Emitter 1 contains 300 (in the figure only three are shown) sequences of the alternating generation regions 8 and output regions 9 connected in parallel by the current in which the width values of the output regions 9 were made equal to the width values of the generation regions 8 and equal to 2 µm. On the side of the emission output corresponding films of luminescent phosphorus were applied on the Emitter 1 and above them epoxy resin of the appropriate form (not shown in the figures) with the refraction index close to the effective refraction index of the heterostructure in the emission output region.

Figure 11:
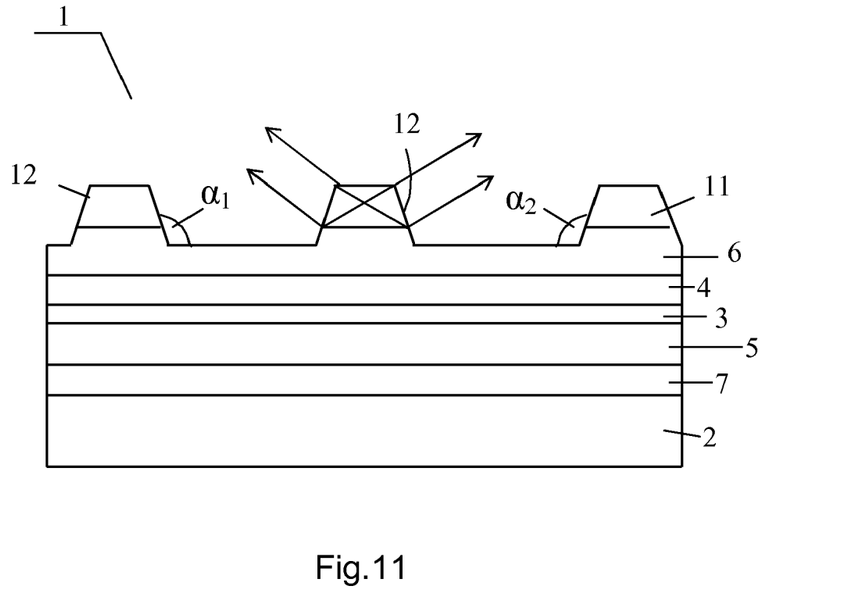
FIG. 11-13 schematically describe (without the metallization layers): the longitudinal cross-sections of the proposed Emitters with the alternating generation regions and emission output regions the output facets of which are inclined and form the linear inclination angles with the external surface of the generation regions.

The proposed Emitter 1 (see FIG. 11) differed from the modification of the Emitter 1 shown in the FIG. 1-3 by the fact that the output facets 12 confining the output regions 9 along the longitudinal optical axis were executed as inclined to the external surface of the generation region 8 and at that the linear angles $\alpha_1$ and $\alpha_2$ are equal to each other by the absolute value and equal to 100°. For this modification every output beam of the emission falls under the right angle on the inclined output facet 12 and directly goes out of the Emitter 1.

Figure 4:
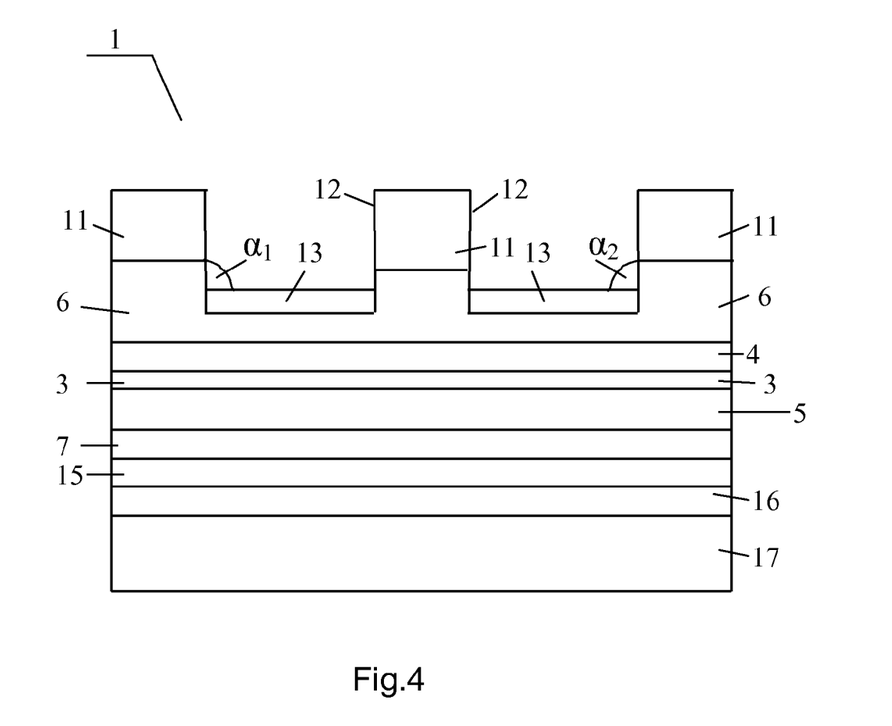
FIG. 4 schematically describes the longitudinal cross-section of the proposed Emitter in which—on the side opposite to the emission output side—the metallization layer, electro-conducting plate and heat-removing base are connected to the confining layer of the heterostructure.
Figure 5:
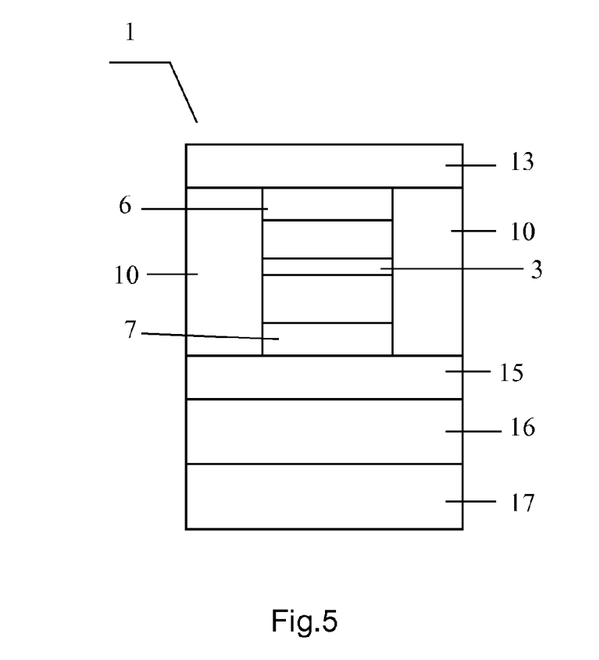
FIG. 5 schematically describes the cross-section of the Emitter passing through the generation region the longitudinal cross-section of which is sketched out in the FIG. 4.
Figure 12:
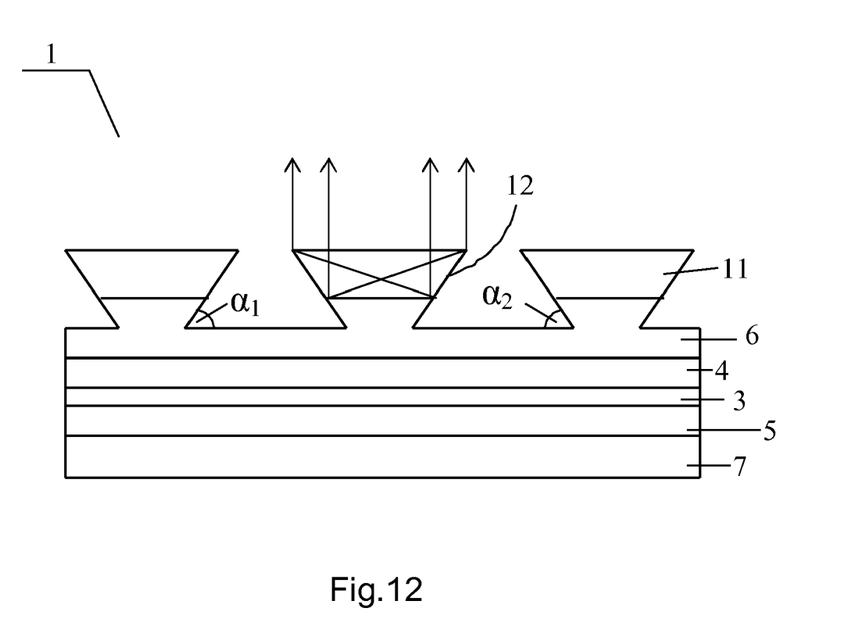

The proposed Emitter 1 differs from the previous modification by the fact that on the output facets 12 the output emission from which is directed in one selected direction along the longitudinal optical axis the clarifying optical films (not shown in the figures) with the reflection coefficient 98% are applied The next modification of the Emitter 1 (see FIG. 12) differed from the modification of the Emitter 1 shown in the FIG. 4-5 by the fact that the output facets 12 were executed as inclined towards the external surface of the generation region 8 and at that the angles $\alpha_1$ and $\alpha_2$ are equal to each other by the absolute value and equal to 50°. For this modification the output emission undergoes the full internal reflection from the inclined output facets 12, changes its direction and goes out through the external surfaces of the output regions 9 by direct incidence upon them.

Figure 13:
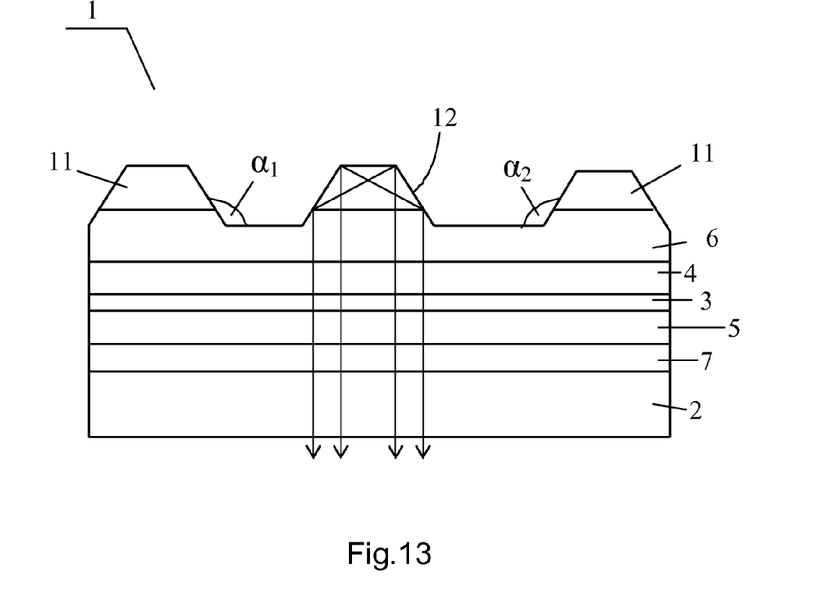

The following modification of the Emitter 1 (see FIG. 13) differed from the modification of the Emitter 1 shown in the FIG. 1-3 by the fact that the output facets 12 were executed as inclined towards the external surface of the generation region 8 and at that the angles $\alpha_1$ and $\alpha_2$ are equal to each other by the absolute value and equal to 130°. For this modification the output emission undergoes full internal reflection from the inclined output facets 12, changes its direction and goes out through the sapphire substrate 2 transparent for emission by direct incidence upon it.

Figure 14:
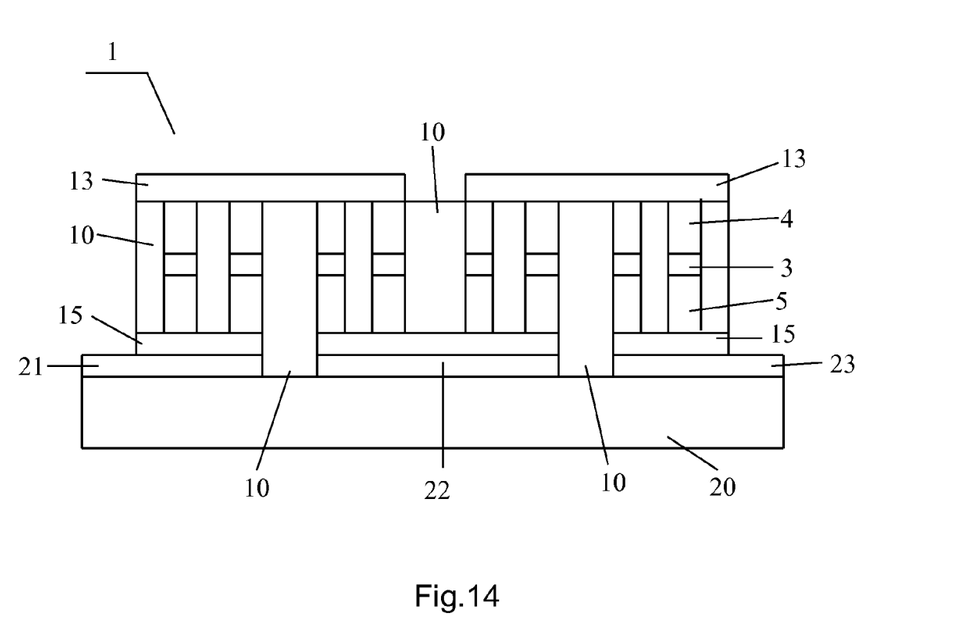
FIG. 14 schematically describes the passing through the generation region cross-section of the Emitter with four sequences of the alternating generation regions 8 (including by two generation sub-regions 18 each) and output regions 9 connected in series by the current.

The following modification (see FIG. 14) differed from the modification of the Emitter 1 shown in the FIG. 6-8 by the fact that it contains connected in series by the current four parallel sequences of the alternating generation regions 8 (with two generation sub-regions 18) and output regions 9 placed on the heat sink ceramic plate 20 made of aluminium nitride with three corresponding metallization layers 21, 22, 23. The input current contact (minus) is connected to the metallization layer 21 while the output current contact (plus) is connected to the metallization layer 23.

INDUSTRIAL APPLICABILITY

Injection emitters are used in the wide range of applications as high-performance solid-state sources of emission—light diodes and superluminiscent emitters in a certain broad range of wavelengths, including sources of emission of white light for lighting.

The invention claimed is:

1. The injection superluminiscent emitter comprising a semiconducting heterostructure containing at least an active layer and waveguide layers comprising at least one sublayer, metallization layers and lateral sides, wherein in said semiconducting heterostructure in the direction of a longitudinal optical axis of the injection superluminiscent emitter at least one sequence of alternating emission generation regions and emission output regions optically coupled to at least one adjacent emission generation region is formed, wherein each of said emission output regions of said sequence of said alternating emission generation regions and said emission output regions has such compositions and thicknesses of the heterostructure layers that on an emission output side only partial restriction of emission in said emission generation region of said heterostructure is achieved, and wherein the complete restriction of emission in said emission generation region of said heterostructure of said sequence is realized in that on an outer surface of said heterostructure at least one of said metallization layers with a high emission reflection coefficient is disposed, and wherein on a surface of an external layer of said heterostructure on the side opposite of the emission output side and on the lateral sides of said injection superluminiscent emitter substances are placed the refraction index of which is significantly less than a effective refraction index of said heterostructure in said generation region, that in said output regions together with said heterostructure layers there is a semiconducting leak-in layer consisting of at least one sublayer and raising above the external surface of said generation region, that every said output region is restricted on its opposite sides in the direction of said longitudinal optical axis by output facets located under predetermined linear angles of inclination $\alpha_1$ and $\alpha_2$, correspondingly with respect to an external surface of said generation region and that a ratio of the refraction index $n_{IN}$ of said leak-in layer to the effective refraction index $n_{\textit{eff}}$ of said heterostructure in said output region with said leak-in layer is equal to a number greater than one, wherein an emission transitions, inside the semiconducting heterostructure, from the emission generation region of the at least one sequence to the at least one adjacent emission output region of the same at least one sequence.

2. The injection superluminiscent emitter according to the claim 1, wherein said metallization layer is placed on a waveguide layer on the emission output side of the emission generation region of said heterostructure.

3. The injection superluminiscent emitter according to the claim 1, wherein the at least one sequence of the alternating emission generation regions and the emission output regions has such compositions and thicknesses of the heterostructure layers that on the side opposite to emission output side only partial restriction of emission in said heterostructure is realized, and wherein the complete restriction of emission in said heterostructure of said sequence is realized in that on the external surface of said heterostructure from the above said side at least one metallization layer with the high emission reflection coefficient, which is close to 1, is placed.

4. The injection superluminiscent emitter according to the claim 3, wherein said one metallization layer is disposed on a waveguide layer of the heterostructure.

5. The injection superluminiscent emitter according to the claim 1, wherein said generation regions consist of at least two stripe generation subregions disposed in the direction of said longitudinal optical axis, and the space between the subregions is filled by a substance having refraction index less than the effective refraction index of said heterostructure in said generation subregions.

6. The injection superluminiscent emitter according to the claim 1, wherein the metallization layers are disposed in said emission output regions on an external surface of said leak-in layer.

7. The injection superluminiscent emitter according to the claim 1, wherein the linear angles $\alpha_1$ and $\alpha_2$ are equal to each other by the absolute value and are equal to $(\pi/2)$, at that the thickness of said leak-in layer located in said output region exceeds the length of said output region multiplied by the tangent of the angle $\phi$ of emission leak from said active layer into said leak-in layer, wherein the angle $\phi$ is determined as arc cosine of the ratio of $n_{eff}$ to $n_{IN}$.

8. The injection superluminiscent emitter according to the claim 1, wherein said linear angles $\alpha_1$ and $\alpha_2$ are equal to each other by the absolute value and are equal to $(\pi/2)+(\phi)$.

9. The injection superluminiscent emitter according to the claim 1, wherein said linear angles $\alpha_1$ and $\alpha_2$ are equal to each other by the absolute value and are equal to $(\pi/4)+(\phi/2)$.

10. The injection superluminiscent emitter according to the claim 1, wherein said linear angles $\alpha_1$ and $\alpha_2$ are equal to each other by the absolute value and are equal to $(3\pi/4)+(\phi/2)$.

11. The injection superluminiscent emitter according to the claim 1, further comprising at least two said sequences electrically connected in parallel.

12. The injection superluminiscent emitter according to the claim 1, comprising at least two said sequences electrically connected in series.

13. The injection superluminiscent emitter according to the claim 1, further comprising a luminescent substance disposed on the emission output side.

14. The injection superluminiscent emitter according to the claim 1, further comprising an epoxy substance disposed on the emission output side.

* * * * *